United States Patent [19]

Lee et al.

[11] Patent Number: 5,236,858
[45] Date of Patent: Aug. 17, 1993

[54] METHOD OF MANUFACTURING A SEMICONDUCTOR DEVICE WITH VERTICALLY STACKED STRUCTURE

[75] Inventors: Kyu H. Lee; Sang H. Chai; Soon I. Yeo; Jin S. Kim; Jin H. Lee, all of Daejeon, Rep. of Korea

[73] Assignee: Electronics and Telecommunications Research Institute, Daejeon, Rep. of Korea

[21] Appl. No.: 796,845

[22] Filed: Nov. 25, 1991

[30] Foreign Application Priority Data

Apr. 17, 1991 [KR] Rep. of Korea .................. 91-6167

[51] Int. Cl.[5] .................. H01L 21/265; H01L 21/70
[52] U.S. Cl. .................. 437/47; 437/52; 437/72; 437/73
[58] Field of Search .............. 437/52, 48, 919, 47, 437/60, 228; 357/23.5, 57; 365/185; 257/303, 306, 309, 401

[56] References Cited

U.S. PATENT DOCUMENTS

| 4,434,433 | 2/1984 | Nishizawa | 365/149 |
|---|---|---|---|
| 4,891,327 | 1/1990 | Okumura | 357/23.6 |
| 4,920,065 | 4/1990 | Chin et al. | 437/60 |
| 5,013,679 | 5/1991 | Kumagai et al. | 437/52 |
| 5,082,795 | 1/1992 | Temple | 437/6 |

FOREIGN PATENT DOCUMENTS 0050772  5/1982  European Pat. Off. ............ 365/149

*Primary Examiner*—Olik Chaudhuri
*Assistant Examiner*—Loc Q. Trinh
*Attorney, Agent, or Firm*—Larson and Taylor

[57] ABSTRACT

The invention relates to a method of manufacturing a DRAM in which a storage capacitor is stacked vertically over a switching junction FET. There is provided a method comprising the steps of: (a) sequentially depositing a nitride layer and a first oxide layer on a substrate; (b) etching away the oxide and nitride layer by means of a trench mask so as to define field and active regions; (c) etching away the substrate of the field region up to a predetermined depth using the remaining oxide and nitride layers as a mask so as to form trench portion; (d) forming a first spacer at the edges of the trench portion; (e) further etching away the substrate of the field region up to a predetermined depth using the remaining oxide and nitride layers and the first spacer as a mask; (f) forming a second spacer at edges of the trench portion; (g) growing a device isolating field oxide layer of the field region after etching away the substrate of the field region; (h) depositing a polysilicon layer thereon after removal of the second spacer and implanting impurity into the substrate through the polysilicon layer so as to form a gate junction region; (i) etching away the polysilicon layer only on the field region so as to define a word line; (j) growing an insulating layer in the field region and removing the first oxide layer on the nitride layer; (k) flatting projected portions of the polysilicon layer and forming an oxide layer on the projected portion and the insulating layer so as to self-contact between storage node of the storage capacitor and drain of the junction FET; (l) depositing a patterned polysilicon layer for the storage node thereon and forming a capacitor dielectric layer around the patterned polysilicon layer; and (m) depositing a polysilicon layer for a plate electrode and defining a bit line by means of a bit line mask.

6 Claims, 8 Drawing Sheets

FIG.4a
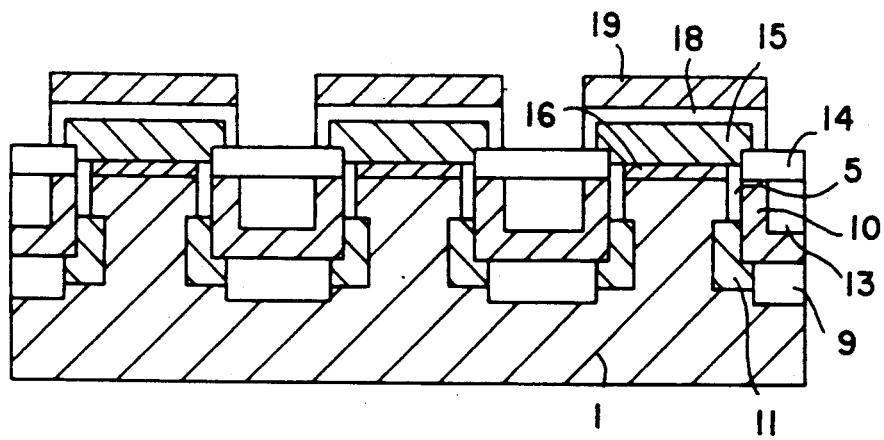
FIG.4b
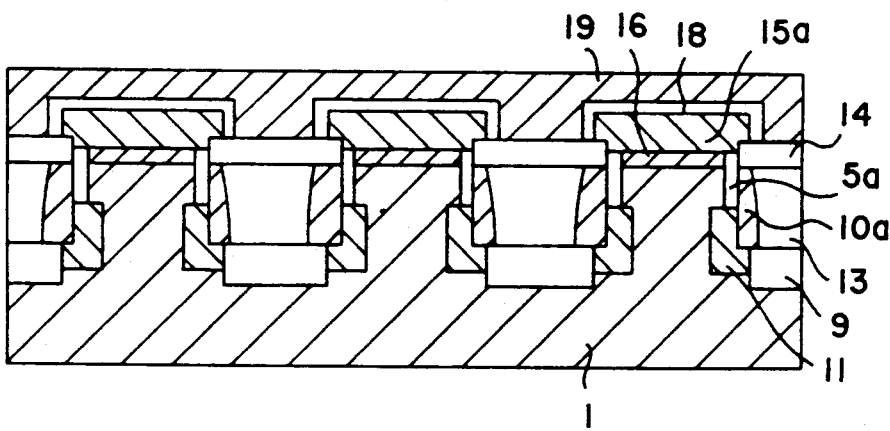
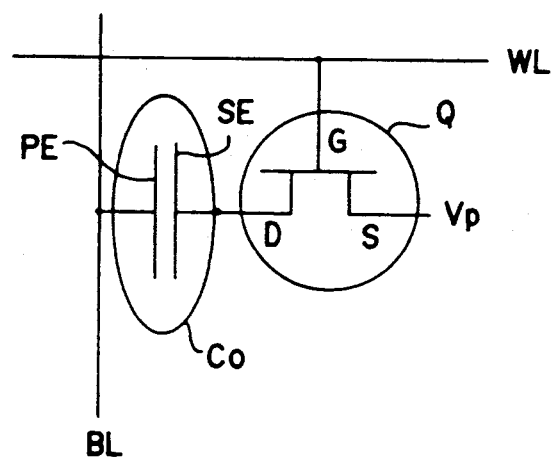
FIG.5

METHOD OF MANUFACTURING A SEMICONDUCTOR DEVICE WITH VERTICALLY STACKED STRUCTURE

BACKGROUND OF THE INVENTION

1. Field of the Invention

The present invention relates to a method of manufacturing a semiconductor device, and more particularly to a method of manufacturing a dynamic random access memory (hereinafter, referred to as "DRAM") with a vertically stacked structure wherein a storage capacitor is formed vertically over a junction field effect transistor (hereinafter, referred to as "junction FET") for switching.

2. Description of the Prior Art

Generally, the high integration of a DRAM has been achieved through the development of fabrication equipment and processing technology of semiconductor devices, designing technique, memory cell structure, etc.

However, there have been many problems in developing highly integrated memory device due to the physically imposed limitations consisting in the semiconductor fabrication equipment and semiconductor device itself.

For example, in order to achieve a highly integrated memory device there should be decreased the area for the storage capacitor. However, the conventional memory structure where the storage capacitor and switching transistor are arranged horizontally makes it, not only substantially impossible to reduce the areas for the capacitor and transistor due to the physically imposed limitations, but also requires the fine configuration technique by semiconductor fabrication equipment in order to achieve a highly integrated memory device. Furthermore, the processing technology such as the fine configuration technique is itself very difficult to develop due to the inherent technical limitations.

FIG. 1a illustrates a cross-sectional view of the structure of a conventional DRAM, wherein the switching transistor and storage capacitor are horizontally arranged, and FIG. 1b is an equivalent circuit diagram of FIG. 1a. Referring to FIG. 1a, 40 and 41 respectively represent the drain and source (or source and drain) of the transistor Q shown in FIG. 1b that are formed on silicon substrate 10. The reference numeral 60 represents the contact between bit line B1 and the diffusion region 40 forming the drain or source. The reference numeral 20 represents an insulating layer for isolating the bit line B1 from word line W13. The word lines W10, W11, . . . and electrode PE are made of polysilicon, and the bit line B1 of aluminum.

In N-channel MOSFET (metal-oxide-semiconductor field effect transistor), the storage capacitor Co is formed between channel 50 and the electrode PE applied with high voltage. In this case, if a pulse voltage is applied to the word line W10, the transistor Q comprising the drain 40 and source 41 connected between the word line W10 and bit line B1 is made conductive, so that the voltage stored in the storage capacitor Co is read out and divided by the bit line B1 and the capacitance of the storage capacitor Co.

More specifically, when the word line W10 is applied with a voltage in order to store data into the conventional DRAM cell, the transistor Q is made conductive by the voltage applied to its gate G, so that the data loaded in the bit line B1 (i.e., voltage of "1" or "0" level) is stored through the conducting transistor Q into the storage capacitor Co.

On the other hand, one electrode of the capacitor Co is the plate electrode applied with a constant reference voltage, while the other electrode that is the storage electrode keeps the voltage stored in the capacitor Co. The voltage of the bit line B1 may be sufficiently stored into the capacitor only provided the voltage of the word line W10 is greater than the voltage of the bit line B1 by the threshold voltage.

In order to read out the data stored in the capacitor, the bit line B1 is precharged with the reference voltage, and the pulse voltage is applied to the word line W10, so that the transistor Q is made conductive so as to deliver the data stored in the capacitor to the bit line. At this time, the bit line undergoes a small voltage variation that ia amplified to readable data.

A typical stacked type conventional DRAM is specifically illustrated in FIG. 1c, wherein the reference numeral 10 represents silicon substrate 10, 40 and 41 respectively the drain and source (or source and drain) of the transistor Q as shown in FIG. 1a, and B1 and W10 respectively the bit line and word lines. The storage capacitor consists of plate electrode PE, storage electrode SE, and dielectric layer DE. This kind of conventional DRAM is disclosed in U.S. Pat. Nos. 4,044,340 issued on Aug. 23, 1977, 3,876,992, 3,979,734, 4,190,466, etc.

In such conventional DRAM's, the areas for the switching transistor and capacitor are great, and the bit line B1 and the plate electrode of the capacitor are separated from each other so that the process for manufacturing the contact, etc. of the memory is complicated, thus making it impossible to achieve a highly integrated memory. Besides, since the transfer transistor consists of a MOS transistor that is lower than a bipolar transistor in the current driving ability, its operating speed is somewhat slower.

Also, U.S. application Ser. No. 07/666,248, as filed by the same applicant on Mar. 8, 1991, discloses a DRAM with vertically stacked structure in which a storage capacitor is formed vertically over a switching transistor. However, the DRAM disclosed in the application uses a bipolar transistor as a switching transistor.

A DRAM with a vertically stacked structure according to the present invention uses a junction FET or a Schottky junction FET as a switching transistor. In details, the present invention is directed to a method for manufacturing the DRAM.

SUMMARY OF THE INVENTION

It is an object of the present invention to provide a method of manufacturing a semiconductor device which is highly integrated by vertically stacking a switching junction FET and a storage capacitor with each other so as to reduce the area for a basic cell.

It is another object of the present invention to provide a method of manufacturing a semiconductor device which uses junction FET as switching transistor so as to increase the operating speed.

According to one aspect of the present invention, there is provided a method of manufacturing a semiconductor device with vertically stacked structure in which a storage capacitor is formed vertically over a switching junction FET comprising the steps of: (a) sequentially depositing a nitride layer and a first oxide layer on a substrate; (b) etching away the oxide and nitride layer by means of a trench mask so as to define field and active regions; (c) etching away the substrate of the field region up to a predetermined depth using the remaining oxide and nitride layers as a mask so as to form trench portion; (d) forming a first spacer at the edges of the trench portion; (e) further etching away the substrate of the field region up to a predetermined depth using the remaining oxide and nitride layers and the first spacer as a mask; (f) forming a second spacer at edges of the trench portion; (g) growing a device isolating field oxide layer on the field region after etching away the substrate of the field region; (h) depositing a polysilicon layer thereon after removal of the second spacer and implanting impurity into the substrate through the polysilicon layer so as to form a gate junction region; (i) etching away the polysilicon layer only on the field region so as to define a word line; (j) growing an insulating layer in the field region and removing the first oxide layer on the nitride layer; (k) flatting projected portions of the polysilicon layer and forming an oxide layer on the projected portion and the insulating layer so as to self-contact between storage node of the storage capacitor and drain of the junction FET; (l) depositing a patterned polysilicon layer for the storage node thereon and forming a capacitor dielectric layer around the patterned polysilicon layer; and (m) depositing a polysilicon layer for a plate electrode and defining a bit line by means of a bit line mask.

The above-mentioned method may further comprise the step of growing a buffering oxide layer between the substrate and the nitride layer.

The first spacer is made of an oxide layer, the second spacer is made of a nitride layer the insulating layer is made of a CVD oxide layer.

In case that the silicon substrate is n type, the polysilicon layer for defining the word line and the gate junction region is p type, and the drain junction region and the polysilicon layer for the storage node are n type.

BRIEF DESCRIPTION OF THE DRAWINGS

This invention may be better understood and its numerous objects and advantages will become apparent to those skilled in the art by reference to the accompanying drawings as follows:

FIG. 1b is an equivalent circuit diagram of the DRAM shown in FIG. 1a;

FIG. 4a and 4b are respectively cross-sectional views taken along lines A-A' and B-B' of FIG. 3: and FIG. 5 is an equivalent circuit diagram of a DRAM of a novel structure according to the present invention.

DESCRIPTION OF THE PREFERRED EMBODIMENT(S)

Figure 1A:
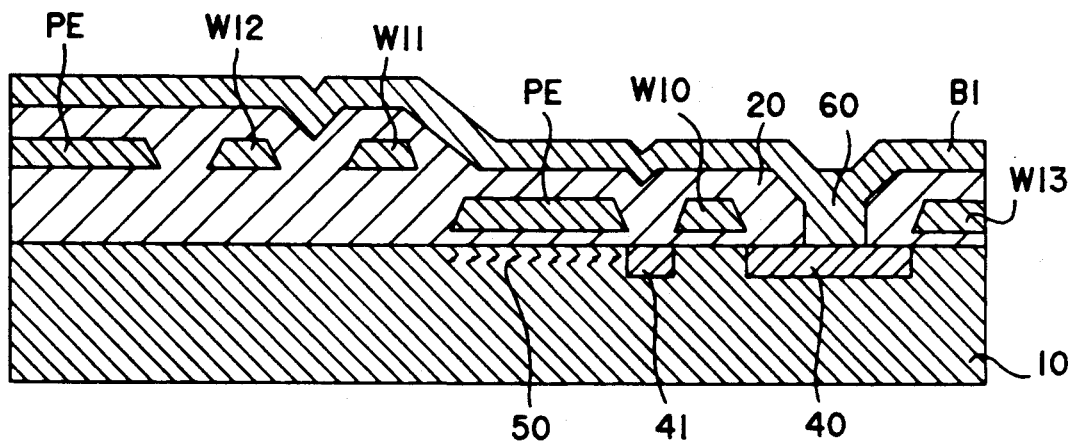
FIG. 1a is a cross-sectional view of a conventional DRAM of the horizontal structure.
Figure 1B:
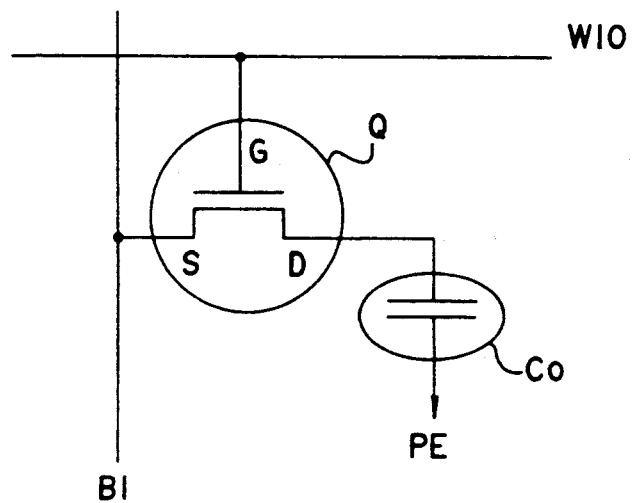
Figure 1C:
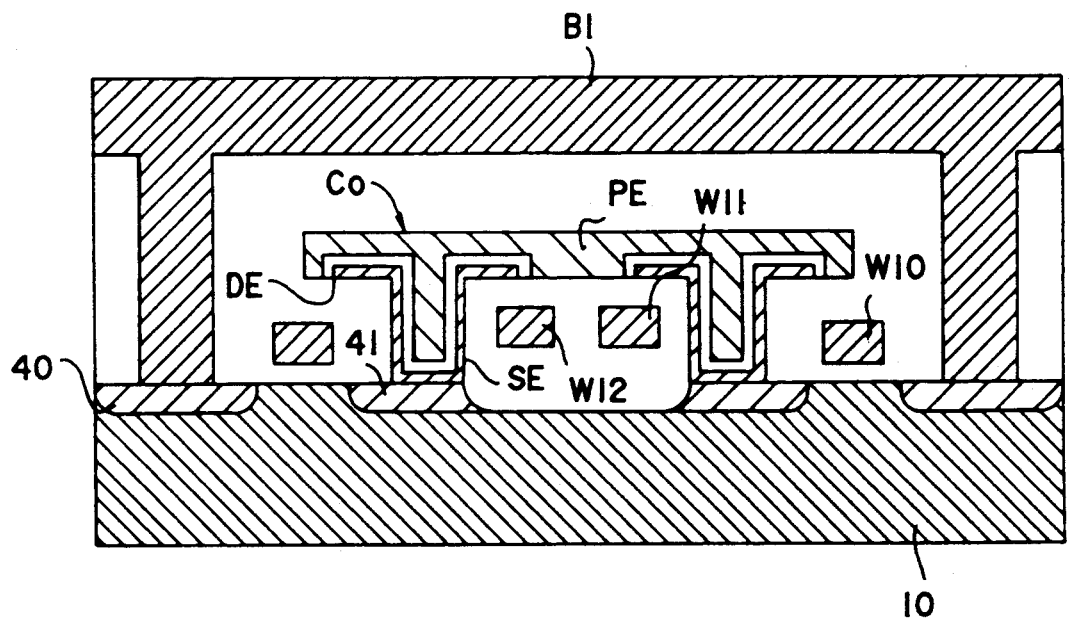
FIG. 1c is a cross-sectional view of a conventional DRAM of stacked structure.
Figure 2A:
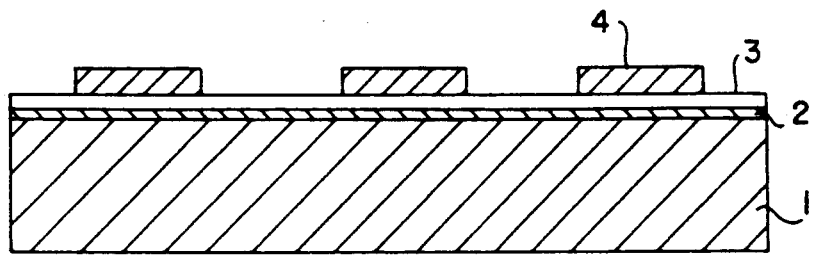
FIGS. 2a to 2q illustrate the processing steps of the inventive method for manufacturing a DRAM having a novel stacked structure.
Figure 2B:
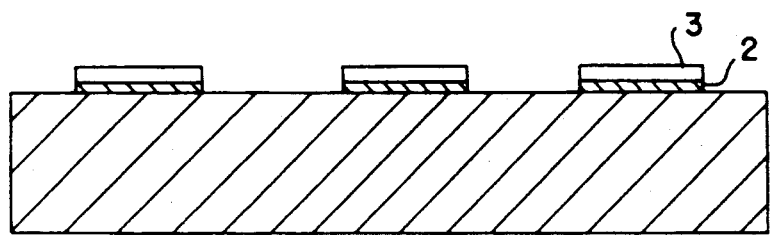
Figure 2C:
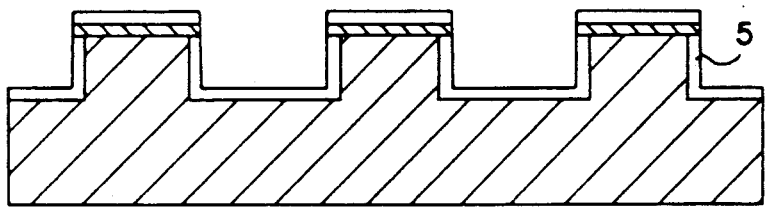
Figure 2D:
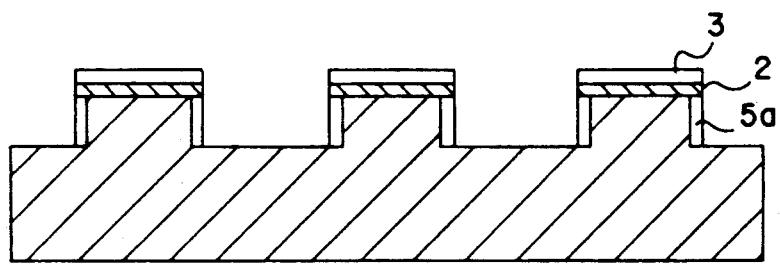
Figure 2E:
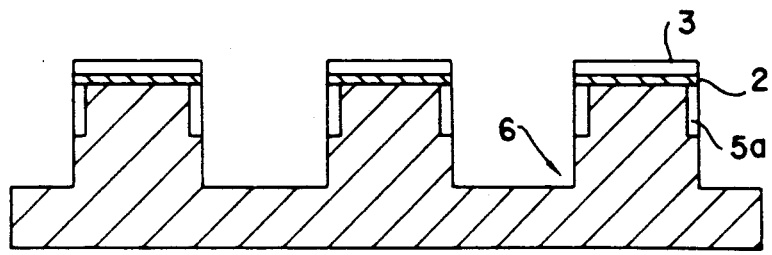
Figure 2F:
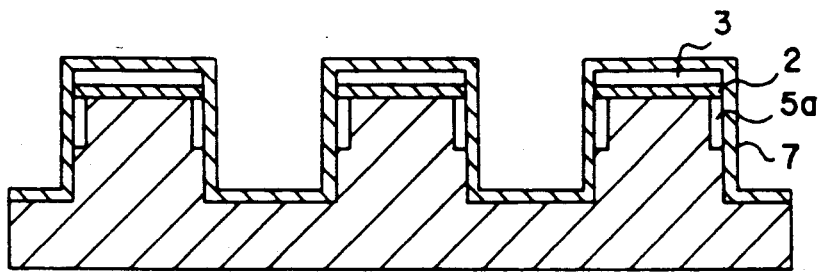
Figure 2G:
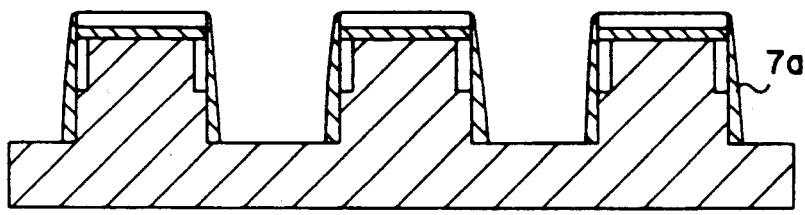
Figure 2H:
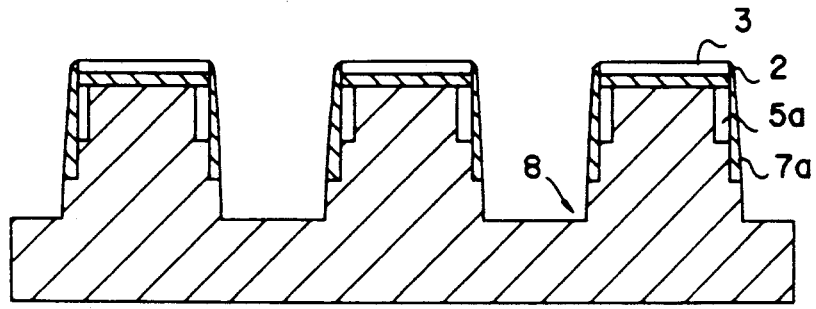
Figure 2I:
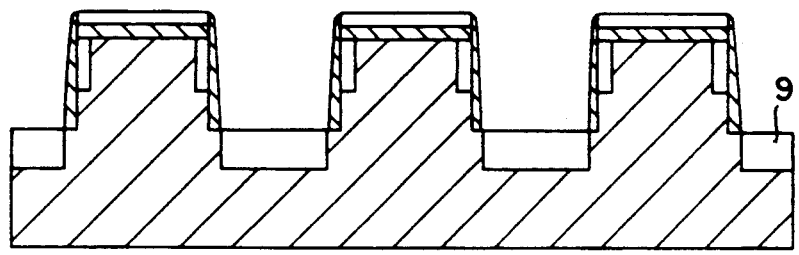
Figure 2J:
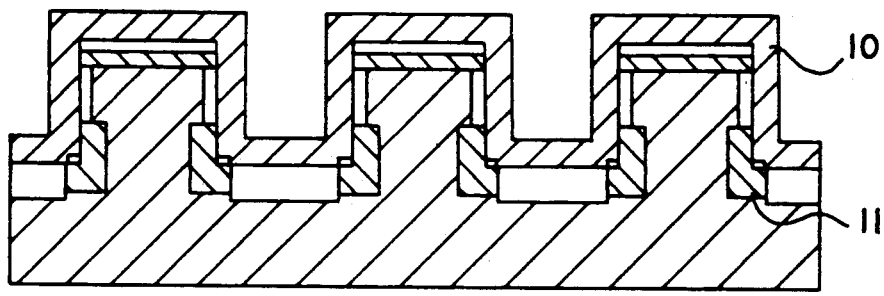
Figure 2K:
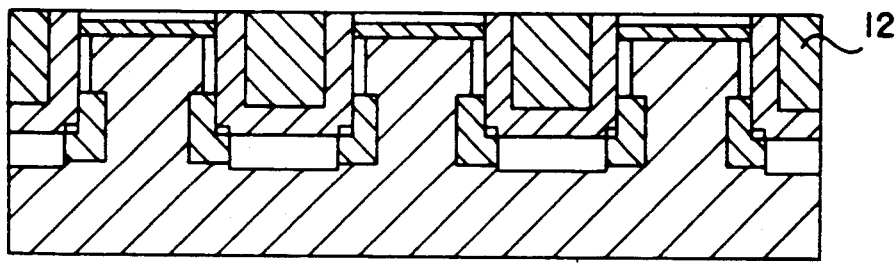
Figure 2L:
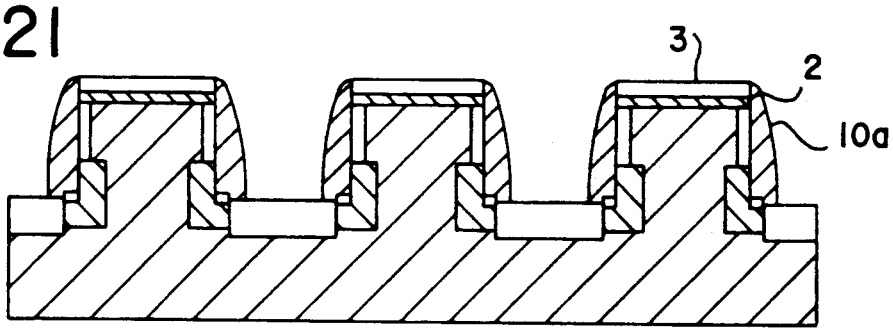
Figure 2M:
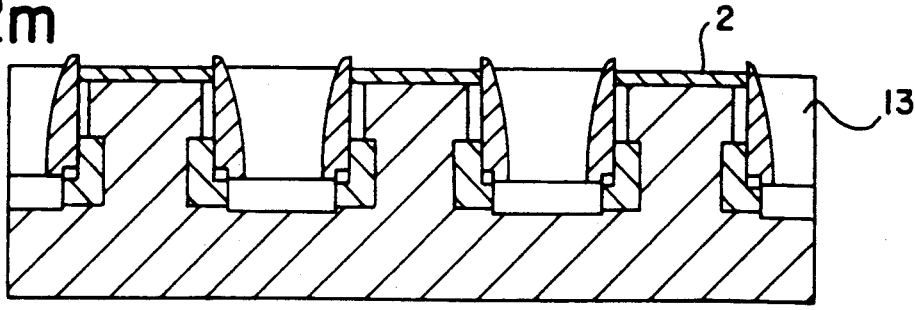
Figure 2N:
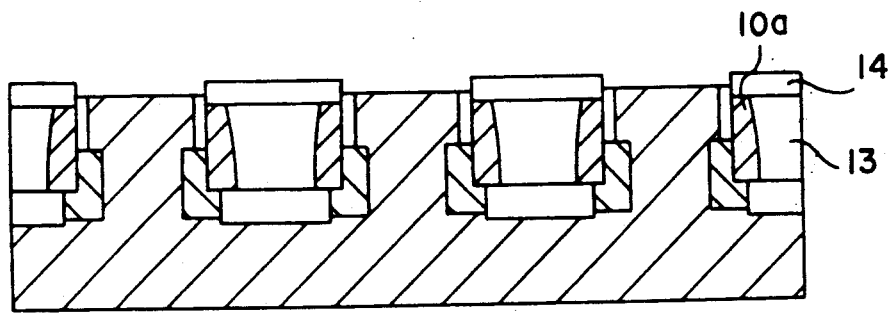
Figure 2O:
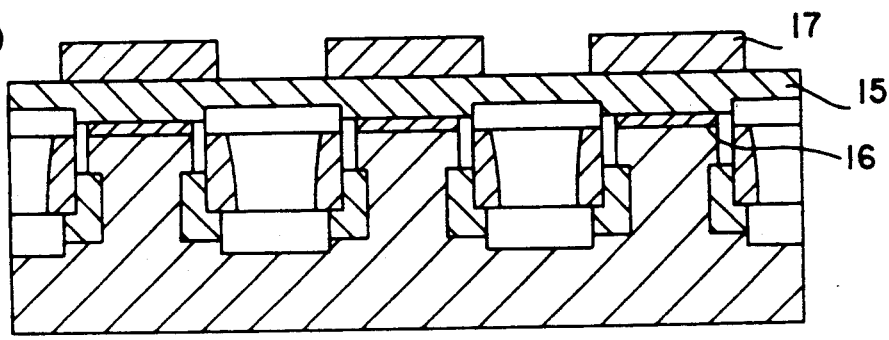
Figure 2P:
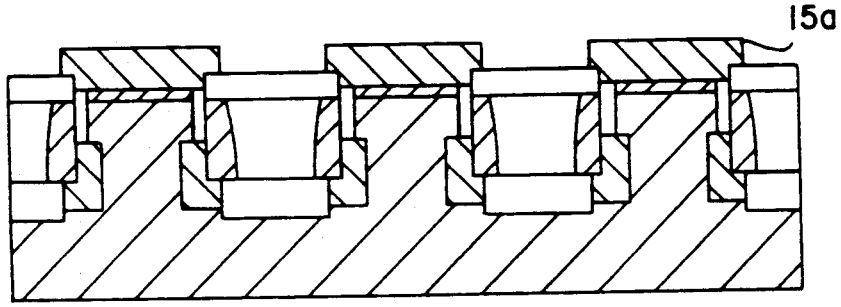
Figure 2Q:
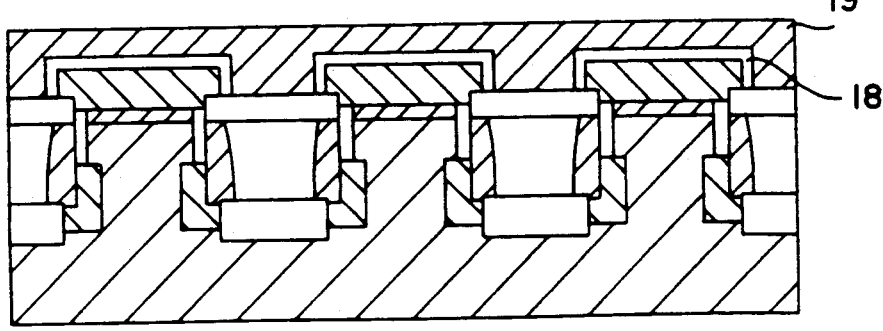

FIGS. 2a to 2q illustrate the steps showing a method of manufacturing a semiconductor device according to the embodiment of the present invention. The processing steps of the inventive method for manufacturing a DRAM of a novel stacked structure are largely divided into two groups, of which one is to form a switching junction FET (the steps from FIG. 2a to FIG. 2n) and the other to form a storage capacitor (the steps FIG. 2o to FIG. 2q).

FIGS. 2a to 2d show the processing steps illustrating the formation of a first spacer after the definition of field and active regions.

Referring to FIG. 2a, on the semiconductor substrate 1 is sequentially formed with a nitride layer(first nitride layer) 2 and an oxide layer(first oxide layer) 3, and then a trench mask layer 4 is formed on the oxide layer 3 to define active regions and field regions in the substrate 1.

With reference to FIG. 2b, in order to define the active regions and the field regions of the isolation regions of junction FET, the oxide and nitride layers 3,2 are sequentially etched away by means of the trench mask layer 4, and then the mask layer 4 is removed.

In the step described above, the field regions are the etched portions(the exposed surface of the substrate) of which the oxide and nitride layers are removed and the active regions are the remaining portions of which the oxide and nitride layers are not etched.

In FIG. 2c, the substrate 1 is etched by anisotropically dry-etching process which is well-known in the art. Then, the etched depth of the substrate is 0.3 μm and the remaining oxide and nitride layers serve as mask layer during the etching process. Subsequently, an oxide layer (second oxide layer) 5 with 1000 Å thickness is grown on the exposed surface of the substrate 1 and at the edges of the trench potions formed in the substrate 1, and then by means of the anisotropically dry-etching process as is well-known in the art the oxide layer 5 on the exposed surface of the substrate 1 is removed and simultaneously first spacers 5a are formed at the edges of the trench portions, as shown in FIG. 2d.

FIGS. 2e to 2i show the steps illustrating the formation of field oxide layer after forming second spacer.

Referring to FIG. 2e, the substrate is further etched away using a mask layer composed of the remaining oxide and nitride layers 3,2 and the first spacers 5a, by means of the anisotropically dry-etching process. Then, the etched depth of the substrate 1 is 0.2 μm.

Next, a nitride layer (second nitride layer) 7 is deposited as shown in FIG. 2f and is anisotropically dry-etched to form second spacers 7a as shown in FIG. 2g. The second spacers 7a are made of the nitride layer 7 and formed at the edges of the first spacers 5a and the trench portions in the substrate 1.

As shown in FIG. 2h, the substrate 1 is also etched away using a mask layer composed of the remaining oxide and nitride layers 3,2 and the second spacers 7a, by means of the anisotropically dry-etching process. Then, the etched depth of the substrate as indicated is 0.2 at 8 μm. With reference to FIG. 2i, a device isolating field oxide layer 9 is grown on the field regions, serving the second spacers 7a and the nitride layer 2 as an oxide process mask.

FIGS. 2j to 2l show the steps illustrating the formation of word line and gate electrode.

Referring to FIG. 2j, after removing the second spacer 7a, a polysilicon layer or Schottky junction material 10 is deposited on the whole surface of the substrate and impurity is implanted into the substrate through the polysilicon layer or Schottky junction material 10 to from gate junction regions 11. In FIG. 2k, a photoresist layer 12 is deposited thereon, and then the polysilicon layer (Schottky junction material) 10 and the photoresist layer is removed up to the surface of the oxide layer 2, thereby making it level.

After removal of the photoresist layer 12, the polysilicon layer of Schottky junction material 10 is dry-etched away using a word line mask, and formed only at side walls of the trench portions, that is, the active regions so as to define the word line, as shown in FIG. 2*l*.

With reference to FIG. 2*m*, after an insulating layer 13 such as CVD oxide layer is formed or grown on the field regions, the remaining oxide layer 3 on the remaining nitride layer 2 of the active regions is removed and the substrate is made level by flattening the projecting portions of the polysilicon layer. In order to form self-contact between storage node and the drain of junction FET, an oxide layer(third oxide layer) 14 is deposited on the insulating layer 13 and the flatted polysilicon layer(Schottky junction material) 10 with thickness of 2000 Å and the remaining nitride layer 2 is removed, as shown in FIG. 2*n*.

FIGS. 2*o* to 2*q* show the steps illustrating the formation of storage capacitor.

First, a polysilicon layer 15 for later forming the storage node of the capacitor is deposited thereon as shown in FIG. 2*o*, and then impurity is implanted into the substrate 1 through the polysilicon layer 15 in order to form drain junction regions 16. Also, the storage node 15*a* of the capacitor is formed by means of capacitor mask layer 17 patterned on the polysilicon layer 15 as shown in FIG. 2*p*.

Subsequently, after removal of the capacitor mask layer 17, capacitor dielectric layer 18 is formed around the storage node 15*a*, and then a polysilicon layer 19 for plate electrode is deposited thereon, defining bit line by means of bit line mask, as shown in FIG. 2*q*.

In the embodiment described above, in case that the substrate 1 is n type, the polysilicon layer(Schottky junction material) 10 is made of P type, and the drain junction region 16 and the polysilicon layer 15 for storage node are n type. Also, in case that the substrate 1 is p type, the word line region 10 and the gate junction region 16 are n type, and the drain junction region 16 and the storage node 15 are p type.

Figure 3:
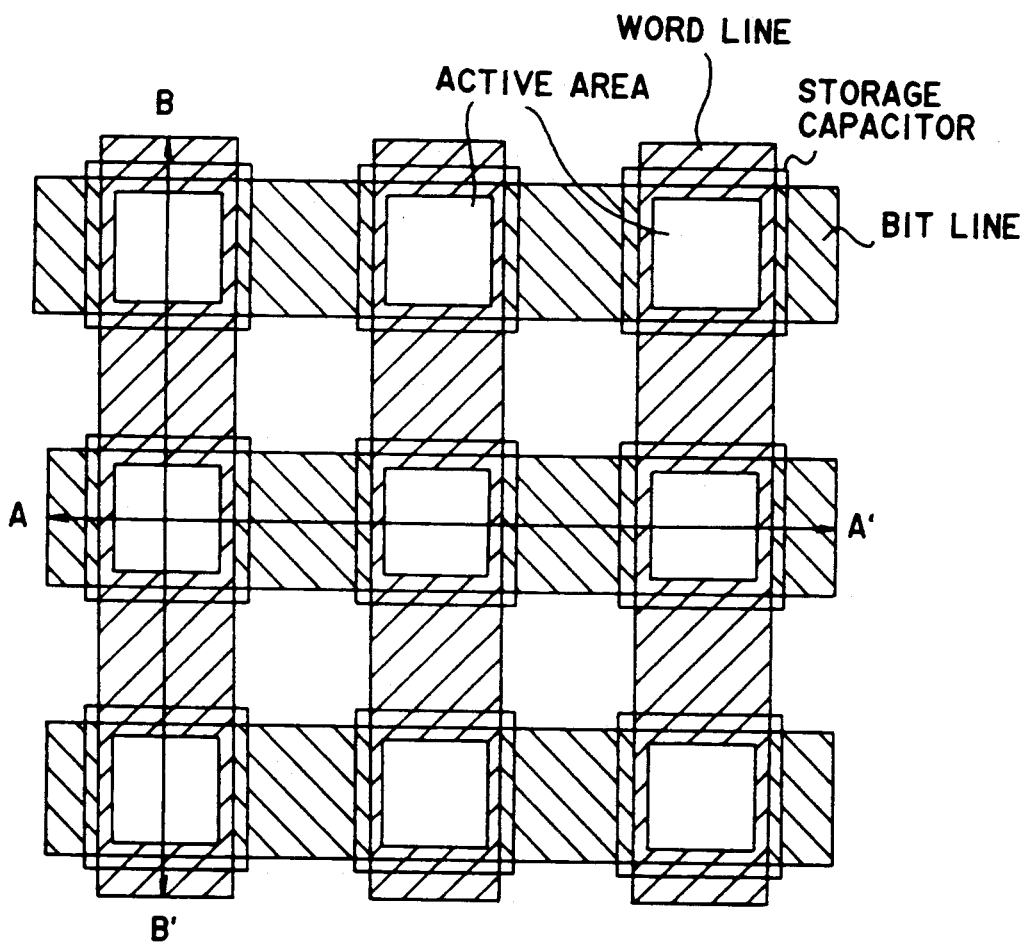
FIG. 3 is a plane view of a DRAM of novel stacked structure manufactured according to the present invention.

FIG. 3 illustrates a layout of a plurality of the inventive junction field effect type DRAM cells arranged matrix-like manufactured by the process as shown in FIGS. 2*a* to 2*q*. FIG. 4*a* is cross-sectional view taken along line A-A' of FIG. 3 in the direction of the bit line, and FIG. 4*b* is cross-sectional view taken along line B-B' of FIG. 3 in the directional of the word line.

Referring to FIGS. 3 to 4*b*, the inventive junction field effect DRAM comprises the junction FET of the active region and the storage capacitor vertically stacked with each other. The substrate 1, gate region 11 and drain region 16 are respectively the source, gate and drain of the junction FET, the polysilicon layer 15*a*, dielectric layer 18 and polysilicon layer 19 are respectively the storage electrode, capacitor dielectric and plate electrode of the storage capacitor, and the polysilicon layer 19 is commonly used as bit line.

The structural characteristics of the inventive DRAM are as follows:

First, the field oxide layer 9 is formed after the isolation region of the junction FET, i.e., the field region in a trench type, as shown in FIG. 2, the active region of the junction FET becomes to have an island-like form.

Second, the drain region 16 and word line 10 of the junction FET are isolated from each other by the first spacer 5*a*, and the gate region 11 directly contacts with the word line 10*a* in the direction of the word line.

Third, the drain region of the junction FET is formed with the storage electrode 15*a* of the capacitor, on which the dielectric layer 18 and plate electrode 19 are sequentially formed, so that the switching junction FET and storage capacitor are vertically stacked.

Fourth, in the structure arranged vertically as described above, the plate electrode is commonly used as the bit line.

FIG. 5 is an equivalent circuit diagram of the inventive DRAM of FIGS. 4*a* to 4*b*. When the source region S of the switching junction FET is applied with the reference voltage, the gate region G is connected to the word line WL, the drain region D is connected to the storage electrode SE, and the plate electrode PE is used as the bit line BL.

Hereinafter will now be described the operation of the inventive DRAM.

When storing data, a voltage is applied to the word line WL so as to make the switching junction FET Q conductive, and the bit line BL is applied with "0" V or "power supply voltage" Vdd according to whether the storage data is "0" or "1", thus storing the data corresponding to the storage capacitor Co. At this time, the source of the switching junction FET maintains the constant reference voltage Vp.

Next, when reading out data, the bit line BL is precharged with the reference voltage, and a voltage is applied to the word line WL so as to turn on the junction FET Q, so that the storage electrode 7 of the storage capacitor Co becomes to the same reference voltage Vp as the source voltage, and therefore the voltage of the bit line BL experiences a small variation that is amplified so as to be readable.

Thus, the present invention gives the following advantages:

1. The bit line is connected to the plate electrode of the storage capacitor, the storage electrode is formed on the collector of the switching junction FET, and the word line directly contacts with the side surface of the gate, so that the switching junction FET and storage capacitor are vertically stacked with each other, thus decreasing the area of the memory cell.

2. Since the area occupied by the fundamental memory cell may be reduced within a given design rule, there may be obtained a highly integrated DRAM.

3. The bit line is used together with the plate electrode of the storage capacitor, so that the manufacturing process of a DRAM cell is facilitated so as to produce a highly integrated memory device with high speed.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. A method of manufacturing a semiconductor device with vertically stacked structure in which a storage capacitor having a storage node is formed vertically over a switching junction FET having a source and a drain, the method comprising the steps of:

(a) sequentially depositing a nitride layer and a first oxide layer on a substrate;
(b) etching away that part of the oxide and nitride layers by using a trench mask so as to define field and active regions;
(c) etching away the substrate of the field region up to a predetermined depth by using a mask comprised of the remaining oxide and nitride layers so as to form a trench portion;
(d) forming a first spacer at the edges of the trench portion;
(e) further etching away the substrate of the field region up to a predetermined depth by using a mask comprised of the remaining oxide and nitride layers and the first spacer to form a second trench portion;
(f) forming a second spacer at edges of the second trench portion;
(g) providing a device isolating field oxide layer on the field region after etching away a portion of the substrate of the field region;
(h) depositing a polysilicon layer after removal of the second spacer and implanting impurity into the substrate through the polysilicon layer so as to form a gate junction region;
(i) etching away at least a portion of the polysilicon layer at the field region so as to define a word line;
(j) providing an insulating layer on the field region and removing the first oxide layer on the nitride layer;
(k) flattening projected portions of the polysilicon layer and forming an oxide layer on the flattened projected portion and the insulating layer so as to permit a self-aligned contact between the storage node of the storage capacitor and the drain of the junction FET;
(l) providing a patterned polysilicon layer for the storage node thereon after removal of the nitride layer and forming a capacitor dielectric layer around the patterned polysilicon layer; and
(m) depositing a polysilicon layer for a plate electrode and defining a bit line by using of a bit line mask.

2. A method of manufacturing a semiconductor device according to claim 1 wherein further comprising the step of growing a buffering oxide layer between the substrate and the nitride layer.

3. A method of manufacturing a semiconductor device according to claim 1 wherein the first spacer is an oxide layer.

4. A method of manufacturing a semiconductor device according to claim 1 wherein the second spacer is a nitride layer.

5. A method of manufacturing a semiconductor device according to claim 1 wherein the insulating layer is a CVD oxide layer.

6. A method of manufacturing a semiconductor device according to claim 1, wherein, when the substrate is n type, the polysilicon layer for defining the word line and the gate junction region is p type, and the drain junction region and the polysilicon layer for the storage node are n type.

* * * * *